US007738888B2

(12) United States Patent
Jeong

(10) Patent No.: US 7,738,888 B2
(45) Date of Patent: Jun. 15, 2010

(54) APPARATUS AND METHOD FOR CONTROLLING TRANSMISSION POWER FOR MOBILE TERMINAL

(75) Inventor: Jae-Woong Jeong, Seoul (KR)

(73) Assignee: Samsung Electronics Co., Ltd (KR)

( * ) Notice: Subject to any disclaimer, the term of this patent is extended or adjusted under 35 U.S.C. 154(b) by 451 days.

(21) Appl. No.: 11/850,469

(22) Filed: Sep. 5, 2007

(65) Prior Publication Data

US 2008/0058026 A1 Mar. 6, 2008

(30) Foreign Application Priority Data

Sep. 5, 2006 (KR) .................... 10-2006-0085359

(51) Int. Cl.
```
H04B 1/00       (2006.01)
H04B 15/00      (2006.01)
H04B 17/00      (2006.01)
H04B 1/16       (2006.01)
H04B 7/00       (2006.01)
H04B 1/38       (2006.01)
H04M 3/493      (2006.01)
H04W 40/00      (2009.01)
G08B 13/14      (2006.01)
```
(52) U.S. Cl. ................... 455/500; 455/63.1; 455/67.11; 455/336; 455/414.2; 455/446; 340/572.1; 375/219
(58) Field of Classification Search ................. 455/500, 455/63.11, 67.11, 336, 446, 414.2; 340/572.1
See application file for complete search history.

(56) References Cited

U.S. PATENT DOCUMENTS 6,823,001 B1 * 11/2004 Chea .......................... 375/219
7,601,149 B2 * 10/2009 DiCarlo et al. ............... 606/34
7,606,531 B2 * 10/2009 Asai et al. ................... 455/11.1
2006/0072646 A1 * 4/2006 Feher .......................... 375/130
2007/0135042 A1 * 6/2007 Shiff et al. .................. 455/13.3
2007/0225000 A1 * 9/2007 Cleveland .................... 455/446
2008/0214164 A1 * 9/2008 Feher ........................ 455/414.2

(Continued)

FOREIGN PATENT DOCUMENTS

KR       1020060036707        5/2006

(Continued)

*Primary Examiner*—Matthew D Anderson
*Assistant Examiner*—Bobbak Safaipour
(74) *Attorney, Agent, or Firm*—The Farrell Law Firm, LLP

(57) ABSTRACT

An apparatus and method for accurately controlling a transmission power using a variable attenuator and a power detector in a mobile terminal is disclosed. To this end, the apparatus includes at least one amplifier for amplifying a transmission signal to be transmitted via an antenna according to a control signal, a power detector for detecting the power level of the amplified transmission signal, and a controller for determining the power level of a transmission signal that has to be transmitted, outputting the control signal to the at least one amplifier in order to control the at least one amplifier to amplify the transmission signal to the determined power, comparing the power level of the transmission signal detected by the power detector with the power level of the transmission signal that has to be transmitted, and controlling the at least one amplifier to compensate the detected power level with a difference between the detected power level and the power level of the transmission signal that has to be transmitted.

6 Claims, 3 Drawing Sheets

U.S. PATENT DOCUMENTS

2008/0291983 A1* 11/2008 Myers .................. 375/219
2008/0293352 A1* 11/2008 Posamentier ............. 455/1
2009/0021374 A1* 1/2009 Stagg .................. 340/572.1
2009/0130981 A1* 5/2009 Nagai et al. ............ 455/63.1

FOREIGN PATENT DOCUMENTS

KR    1020060071948    6/2006

* cited by examiner

APPARATUS AND METHOD FOR CONTROLLING TRANSMISSION POWER FOR MOBILE TERMINAL

PRIORITY

This application claims priority under 35 U.S.C. §119(a) to a Korean Patent Application filed in the Korean Intellectual Property Office on Sep. 5, 2006 and assigned Serial No. 2006-85359, the entire disclosure of which is hereby incorporated by reference.

BACKGROUND OF THE INVENTION

1. Field of the Invention

The present invention generally relates to a mobile terminal that controls transmission power. In particular, the present invention relates to an apparatus and method for controlling transmission power.

2. Description of the Related Art

Generally, in a wireless communication device such as a terminal and a base station used in mobile communication systems, such as a Code Division Multiple Access (CDMA) system and a Personal Communication Service (PCS) system, a mobile terminal includes a Drive Amplifier (DA) and a Power Amplifier (PA). The DA amplifies a signal, i.e., a transmission Radio Frequency (RF) signal, to a power level that is high enough for the RF signal to be power-amplified by the PA. The PA power-amplifies the RF signal output from the DA to a power level that is high enough for the RF signal to be transmitted via an antenna. The power-amplified RF signal passes through a duplexer and is transmitted wirelessly via an antenna. For example, the DA amplifies the RF signal up to about 0 dBm in order to allow the PA to amplify the RF signal. The PA then amplifies the RF signal output from the DA up to about 28 dBm and applies the RF signal to the duplexer.

In mobile communication systems such as a Code Division Multiple Access (CDMA) system and a Personal Communication Service (PCS) system, a mobile terminal divides a transmission power level into several classes within a specified level range and controls the transmission power level of one of the classes according to a propagation environment, thereby reducing unnecessary current consumption or interference. Generally, in a terminal or a base station of a CDMA or PCS system, a transmission power level is reduced with an increase in the Received Signal Strength Indicator (RSSI) of a received RF signal, and the transmission power level is increased with a reduction in the RSSI of the received RF signal.

Such a transmission power control of the mobile terminal is of high importance in the communication system. In a CDMA system, the RSSI of a received signal has to be determined, and a transmission signal has to be transmitted at a transmission power level corresponding to the determined RSSI. After a call connection with a base station, the base station may finely control the transmission power level. At this time, the mobile terminal needs to output a transmission signal at the transmission power level as controlled by the base station. As such, the transmission power control of the mobile terminal is of significant importance.

In the transmission power control, it is necessary to match the power level of a transmission signal that has to be transmitted by the mobile terminal with the power level of an output signal actually transmitted by the mobile terminal. However, due to the non-linear property of a transmitter Power Amplifier (PA), the mobile terminal stores an RF analog Subsystem (RAS) compensation table for storing a compensation value in order to output a desired transmission power level, instead of an actually output transmission power level. For the RAS compensation table, 16 power indices for a specific number of terminals are created, and Automatic Gain Control (AGC) values corresponding to the power indices are measured and stored. The RAS is used to compensate the AGC characteristic of the RF amplifier to at least improve linearity. An average value and a weight value are calculated for the stored AGC values. The RAS compensation table is a sample table that is created based on the calculated average value and weight value. For the remaining terminals, only AGC values corresponding to two power indices are measured and AGC values corresponding to the other indices are automatically stored according to weight values acquired from the RAS compensation table.

In the transmission power control, the transmission power of the mobile terminal may also vary with the temperature and the frequency of the channels. To prevent a variation in the transmission power, the mobile terminal has a temperature and channel compensation table that stores offset values to compensate for to the temperature and the frequency variation of the channels.

To control the transmission power using the RAS compensation table and the temperature and channel compensation table, the mobile terminal may be configured as illustrated in FIG. 1.

Once a reception signal received from a system is detected by an RSSI detection unit 103, a controller 100 determines a transmission power level according to the detected RSSI value and determines an AGC value corresponding to the determined transmission power level by referring to an RAS compensation table 105. The controller 100 then controls a Drive Amplifier (DA) 102 and a Power Amplifier (PA) 104 according to the determined AGC value. Under the control of the controller 100 that outputs a control signal by referring to the RAS compensation table and temperature and channel compensation table 105, a transmission signal is power-amplified by the DA 102 and the PA 104 and then transmitted via an antenna ANT.

For the transmission power control, it is necessary to compensate for the difference between the power level of the signal to be transmitted and the actually output signal power level using an RAS compensation table for storing a compensation value for compensation for the non-linear property of the PA and a temperature and channel compensation table for storing an offset value for compensation for variation with temperature and frequency channels.

However, even if a variation in the transmission power level is compensated for using the RAS compensation table, the compensation may not be accurate for every terminal because of the use of a statistical method.

Moreover, when a variation in the transmission power level is compensated for using the temperature and channel compensation table that stores offset values according to the temperature and the frequency of the channels, the compensation may not be accurate for every terminal because measurements acquired by sampling a random power variation are applied to every terminal even though a specific power variation corresponding to the temperature and the frequency of a channel exists for each terminal.

SUMMARY OF THE INVENTION

An aspect of the present invention is to address at least the above problems and/or disadvantages and to provide at least the advantages described below. Accordingly, an aspect of the present invention is to provide an apparatus and method for controlling a transmission power, in which the power of an actually output transmission signal is accurately compensated to a transmission power that has to be transmitted during a transmission power control of a mobile terminal.

According to one aspect of the present invention, there is provided an apparatus for controlling a transmission power for a mobile terminal. The apparatus includes at least one amplifier for amplifying a transmission signal to be transmitted via an antenna according to a control signal, a power detector for detecting a power level of the amplified transmission signal, and a controller for determining the power level of a transmission signal that has to be transmitted, outputting the control signal to the amplifiers in order to control the amplifiers to amplify the transmission signal to the determined power level, comparing the power level of the transmission signal detected by the power detector with the power level of the transmission signal that has to be transmitted, and controlling the at least one amplifier to compensate the detected power level with a difference between the detected power level and the power level of the transmission signal that has to be transmitted.

According to another aspect of the present invention, there is provided a method for controlling the transmission power for a mobile terminal that includes a first amplifier for amplifying a transmission signal according to a control signal, a second amplifier for amplifying the transmission signal output from the first amplifier according to an ON control signal, and an antenna via which the transmission signal amplified by the second amplifier is transmitted. The method includes a determining the power level of a transmission signal that has to be transmitted and outputting to the first amplifier and the second amplifier a control signal for amplifying the transmission signal to the determined power level, splitting the transmission signal output from the amplifiers into a transmission signal for transmission via the antenna and a feedback signal, detecting the power level of the feedback signal, and comparing the power level of the transmission signal output via the antenna with the power level of the transmission signal that has to be transmitted, and outputting to the first amplifier and the second amplifier a control signal for compensating by the difference between the power level of the output transmission signal and the power level of the transmission signal that has to be transmitted.

BRIEF DESCRIPTION OF THE DRAWINGS

The above and other features and advantages of an exemplary embodiment of the present invention will be more apparent from the following detailed description taken in conjunction with the accompanying drawings, in which.

DETAILED DESCRIPTION OF THE EXEMPLARY EMBODIMENT

Figure 1:
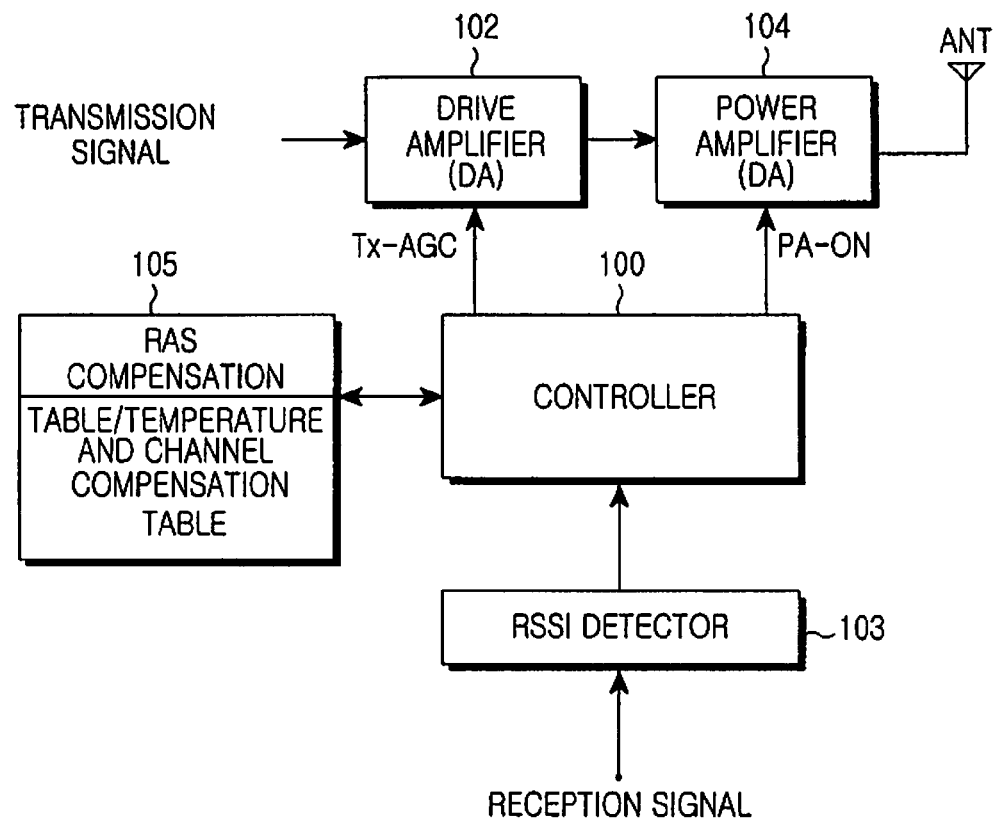
FIG. 1 is a block diagram of an apparatus for controlling the transmission power for a mobile terminal according to the prior art.

The matters defined in the description such as a detailed construction and elements are provided to assist in a comprehensive understanding of an exemplary embodiment of the invention. Accordingly, those of ordinary skill in the art will recognize that various changes and modifications of the embodiment described herein can be made without departing from the scope and spirit of the invention. Also, descriptions of well-known functions and constructions are omitted for clarity and conciseness. Throughout the drawings, the same drawing reference numerals will be understood to refer to the same elements, features and structures.

The present invention provides a method by which, during transmission power control of a mobile terminal, the power level of an actually output transmission signal is detected using a power detector circuit, the detected power level is compared with transmission power level that has to be transmitted, and the power is output after being compensated for by the power difference.

Figure 2:
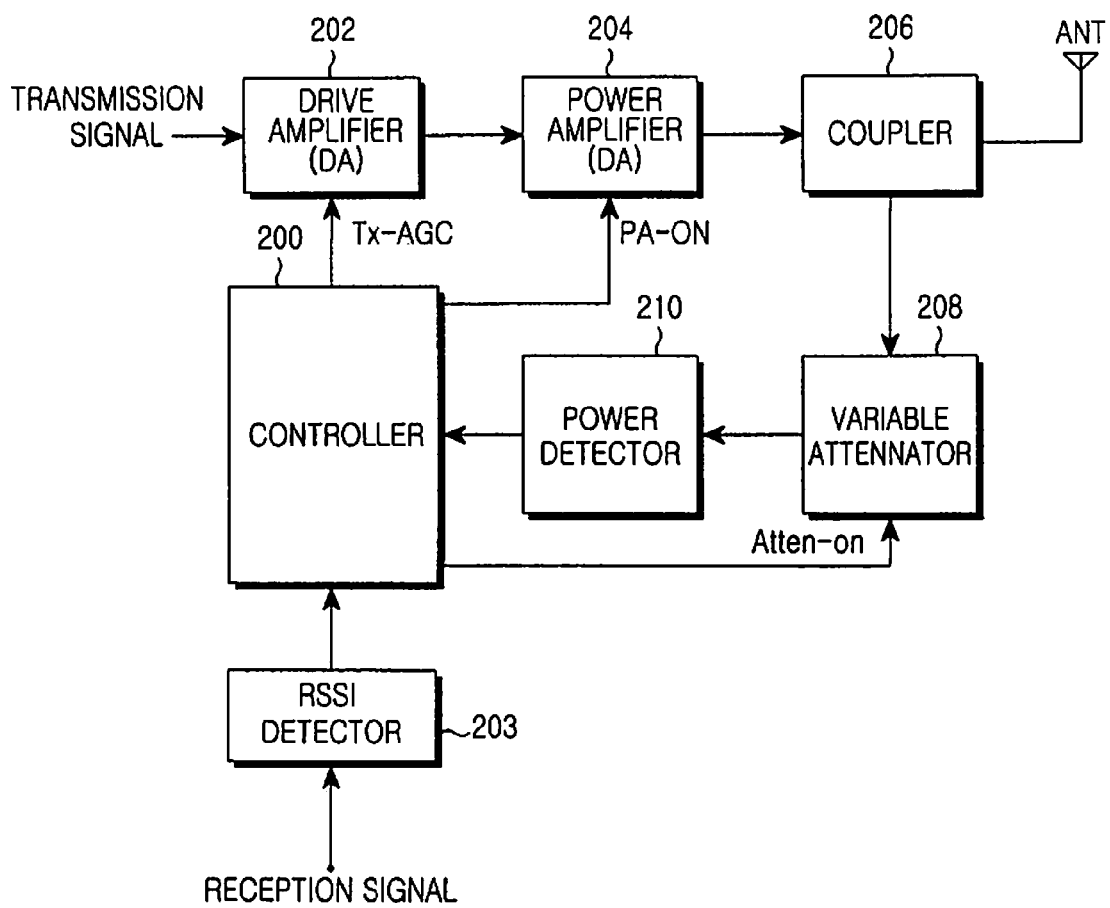
FIG. 2 is a block diagram of an apparatus for controlling the transmission power for a mobile terminal according to an exemplary embodiment of the present invention.

Hereinafter, the internal structure of an apparatus for controlling transmission power in order to accurately compensate the power of an actually output transmission signal to a transmission power necessary for the signal to be transmitted during the transmission power control of the mobile terminal according to an exemplary embodiment of the present invention will be described with reference to FIG. 2. The apparatus includes a controller 200, a Received Signal Strength Indicator (RSSI) detector 203, a Drive Amplifier (DA) 202, a Power Amplifier (PA) 204, a coupler 206, a variable attenuator 208, and a power detector 210.

In the present invention, with a single terminal, Automatic Gain Control (AGC) values corresponding to 16 power indices are measured, and an AGC table is created for storing the power indices and the AGC values that are mapped to each other. The created AGC table is stored in every terminal. A transmission signal input to the DA 202 has been processed by stages that precede the DA 202. A description regarding the stages preceding the DA 202 are well known, and thus will not be provided herein.

The controller 200 of the mobile terminal performs the overall control of the mobile terminal. Upon receipt of a reception signal from a system, the controller 200 determines a transmission power to be transmitted according to an RSSI detected by the RSSI detector 203. The controller 200 then determines an AGC value for outputting the determined transmission power and outputs an AGC control signal TX_AGC corresponding to the determined AGC value to the DA 202. The controller 200 also outputs to the PA 204 a control signal PA_ON for controlling the PA 204.

The controller 200 then controls the transmission signal that is power-amplified by the DA 202 and the PA 204 to be input to the variable attenuator 208 through the coupler 206. The controller 200 that determines if the power level of the transmission signal falls within a high power range or a low power range. If the power of the transmission signal falls within the high power range, the controller 200 outputs to the variable attenuator 208 an ON control signal Atten_ON for turning on the variable attenuator 208. However, if the power of the transmission signal falls within the low power range, the controller 200 does not output a signal for controlling the variable attenuator 208, and thus the variable attenuator 208 bypasses to the power detector 210 a signal input from the coupler 206. The high power range and the low power range are preset by dividing the entire transmission power range into two levels. For example, for an entire transmission power range of −50~30 dBm, i.e., a dynamic range of 80 dBm, the low power range may be set to −50~−10 dBm, and the high power range may be set to −10~30 dBm. In the present invention, the transmission power control operation performed by the controller 200 will be described for the high power range and the low power range.

When the power level of the transmission signal that has to be transmitted falls within the high power range, the controller 200 controls the PA 204 to be turned on in order to output a high power level for the transmission signal, and controls the variable attenuator 208 to be turned on in order to attenuate the amplified transmission signal by a level corresponding to the high power level.

When the transmission power level to be transmitted is in the high power range, it falls outside a power range that can be detected by the power detector 210. For this reason, the variable attenuator 208 adjusts the amplified transmission signal to a power level that can be detected by the power detector 210.

When the controller 200 controls the variable attenuator 208 to be turned on, the controller 200 compensates the power detected by the power detector 210 by the power attenuated by the variable attenuator 208 and recognizes the compensated power as the power of a currently output transmission signal. The controller 200 then compares the recognized power with the power of the transmission signal that has to be transmitted, adjusts the AGC control signal Tx_AGC according to the power difference, and controls the DA 202 with the adjusted AGC control signal Tx_AGC. The present invention is implemented as a feedback loop, so as to stably maintain the transmission power level if the power level of the currently output transmission signal is the same as the power level of the transmission signal that has to be transmitted.

When the power level of the transmission signal that has to be transmitted falls within the low power range, the controller 200 outputs a control signal for turning off the variable attenuator 208 and outputs to the power detector 210 the transmission signal output from the coupler 206 without attenuating the transmission signal. The power detector 210 detects the power level of the transmission signal and outputs the detected power level to the controller 200. The controller 200 then adds the attenuation power to the detected power level in the coupler 206 and recognizes the resulting power level as the power level of the transmission signal that is currently output via an antenna. The controller 200 then compares the recognized power level of the currently output transmission signal with the power level of the transmission signal that has to be transmitted, adjusts the AGC control signal Tx_AGC according to the power difference, and controls the DA 202 according to the adjusted AGC control signal Tx_AGC. The present invention may be implemented as a feedback loop in order to stably maintain the transmission power level if the power level of the currently output transmission signal is the same as the power level of the currently transmission signal that has to be transmitted.

The power control operation according to whether the power of the transmission signal that has to be transmitted falls within the low power range or the high power range will be described by way of an example.

It is assumed that the entire transmission power range is −50~30 dBm, the low power range is −50~−10 dBm, and the high power range is −10~30 dBm. It is also assumed that the coupler 206 is a 10 dBm coupler and that the variable attenuator 208 is an attenuator for attenuating the power level of an input signal by 40 dBm.

When the power level of a transmission signal that has to be transmitted by the controller 200 is −30 dBm, the controller 200 recognizes that the power level of the current transmission signal falls within the low power range. The controller 200 then outputs a control signal for turning off the variable attenuator 208 so that the variable attenuator 208 bypasses to the power detector 210 a transmission signal output from the coupler 206, and the power detector 210 detects the power level of the input transmission signal. In this example, the power level of the transmission signal detected by the power detector 210 is assumed to be −38 dBm. The transmission signal output from the PA 204 is attenuated by 10 dBm in the coupler 206 and is then output to the variable attenuator 208.

The controller 200 then compensates the power level of the transmission signal detected by the power detector 210, i.e., −38 dBm, by the attenuation power level in the coupler 206, i.e., 10 dBm, and thus recognizes the power of the transmission signal currently output via an antenna as −28 dBm. The controller 200 then recognizes that the difference between the power level of the transmission signal that has to be transmitted, i.e., −30 dBm, and the power level of the currently output transmission signal, i.e., −28 dBm, is −2 dBm. The controller 200 then adjusts the transmission AGC value by −2 dBm and controls the DA 202 according to the adjusted transmission AGC value.

When the power level of the transmission signal that has to be transmitted by the controller 200 is assumed to be 30 dBm, the controller 200 recognizes that the power of the current transmission signal falls within the high power range. The controller 200 then outputs a control signal for turning on the variable attenuator 208, so that the a transmission signal output from the coupler 206 is 40 dBm attenuated by the variable attenuator 208 and then is output to the power detector 210. The power detector 210 detects the power level of the transmission signal output from the variable attenuator 208. In this example, the power level of the transmission signal detected by the power detector 210 is assumed to be −22 dBm. The transmission signal output from the PA 204 is attenuated by 10 dBm in the coupler 206 and then is output to the variable attenuator 208.

The controller 200 then compensates the power level of the transmission signal detected by the power detector 210, i.e., −22 dBm, by the attenuation power level in the coupler 206, i.e., 10 dBm, and the attenuation power level in the variable attenuator 208, i.e., 40 dBm, and thus recognizes the power level of the transmission signal currently output via the antenna as 28 dBm. The controller 200 then recognizes that the difference between the power level of the transmission signal that has to be transmitted, i.e., 30 dBm, and the power level of the currently output transmission signal, i.e., 28 dBm, is 2 dBm. Thus, the controller 200 adjusts a transmission AGC value with 2 dBm and controls the DA 202 according to the adjusted transmission AGC value.

The DA 202 settles the lack of a gain of the PA 204 and generates an input power that is sufficiently high for the PA 204. In the present invention, upon input of the AGC control signal Tx_AGC from the controller 200, the DA 202 amplifies the transmission signal by a power level corresponding to the input AGC control signal and outputs the transmission signal to the PA 204. A transmitter has a constant input signal, which is unlike a receiver. The PA amplifies the input signal to a power level that is sufficiently high. However, in some situations the PA cannot supply enough of a gain, and since the input signal being at a predetermined power level, the PA cannot amplify the input signal to a sufficient power level. Therefore, the DA 202 is needed to compensate for the lack of a gain of the PA 204.

The PA 204 performs power amplification in order to allow the last transmission end of the mobile terminal to output a signal with a sufficiently high power. In the present invention, the PA 204 power-amplifies the transmission signal input from the DA 202 according to the control signal PA_ON of the controller 200 and outputs the power-amplified signal through the coupler 206 and the antenna.

The coupler 206 splits the transmission signal output from the PA 204 by a particular signal power for output to the antenna and the variable attenuator 208.

The variable attenuator 208 operates according to the ON control signal Atten_ON of the controller 200 and attenuates the transmission signal output from the coupler 206 by a predetermined power level according to the ON control signal Atten_ON. If the ON control signal is not input to the variable attenuator 208, the variable attenuator 208 bypasses to the power detector 210 the transmission signal input from the coupler 206.

The power detector 210 detects the power level of the transmission signal output from the variable attenuator 208. The power detector 210 then reports to the controller 200 the detected power level of the transmission signal. Since a general power detector has a dynamic range that is much narrower than the entire transmission power range, the general power detector is used only to limit the maximum transmission power. However, in the present invention, when the power level of a transmission signal that has to be transmitted falls within a power range that cannot be detected by the power detector 210, i.e., the high power range, the variable attenuator 208 is driven for power attenuation, thereby enabling the power detector 210 to detect the entire transmission power range. In the present invention, when the power of the transmission signal that has to be transmitted falls within a power range that can be detected by the power detector 210, i.e., the low power range, the power detector 210 can detect the power of the transmission signal output from a transmission end without driving the variable attenuator 208. Thus, in the present invention, the power detector 210 can detect the entire power range of the transmission signal output from a transmission end.

Figure 3:
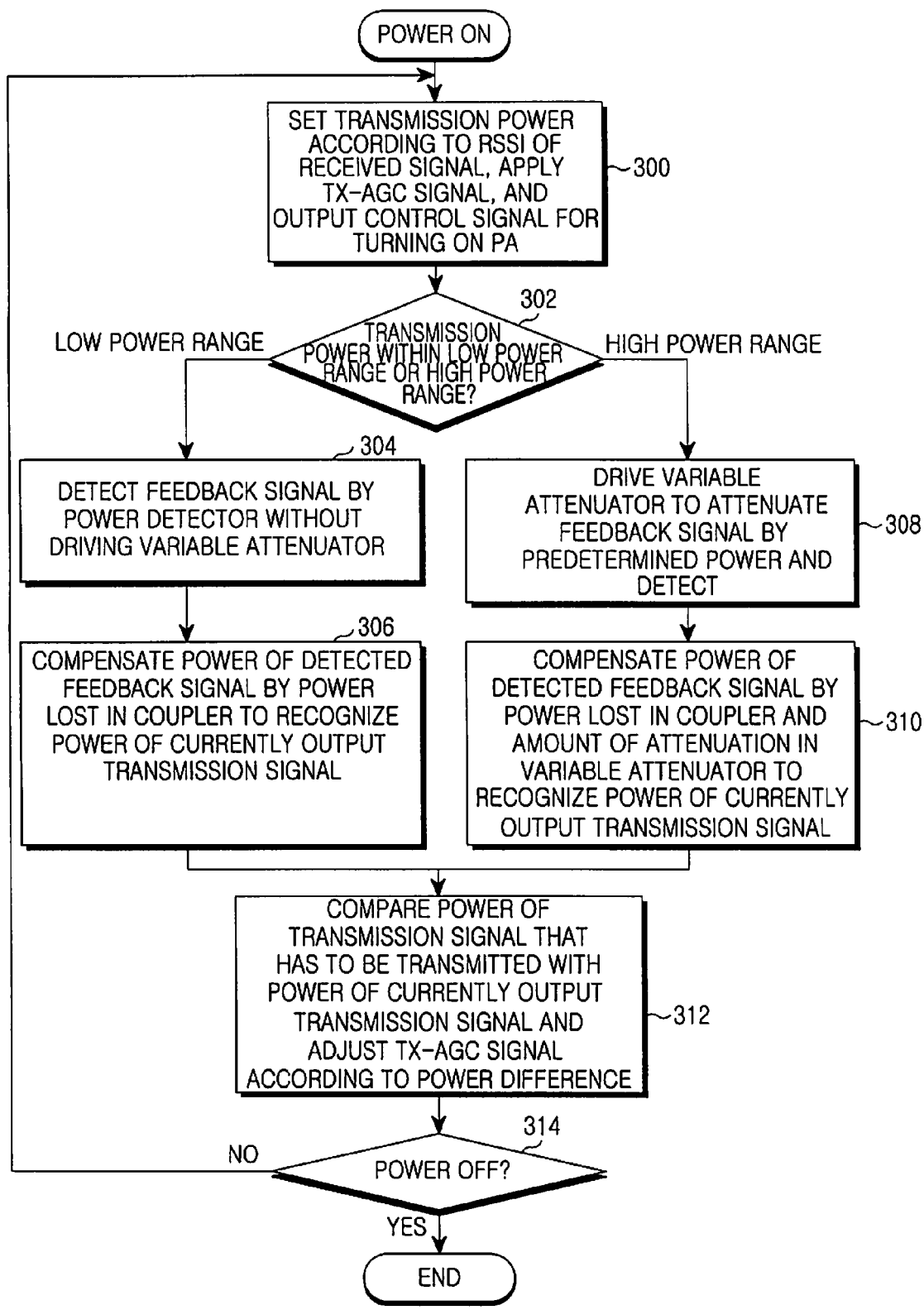
FIG. 3 is a flowchart illustrating a process in which a mobile terminal controls the transmission power according to an exemplary embodiment of the present invention.

Hereinafter, a process for controlling a transmission power by the apparatus illustrated in FIG. 2 will be described with reference to FIG. 3.

Once the mobile terminal is powered on, the controller 200 sets a transmission power level according to the RSSI of a received signal, supplies to the DA 202 a control signal for controlling a transmission AGC value, and then outputs the control signal for turning on the PA 204 in step 300.

The controller 200 determines if the power level of the transmission signal that has to be transmitted falls within the low power range or the high power range. If the power level falls within the low power range, steps 304 and 306 are performed. If the power level falls within the high power range, steps 308 and 310 are performed.

In step 304, the controller 200 controls the power detector 210 to detect a feedback signal without driving the variable attenuator 208. The controller 200 compensates the power level of the feedback signal detected by the power detector 210 by a power level that is lost in the coupler 206, and thus recognizes the compensated power level as the power level of the currently output transmission signal in step 306.

In step 308, the controller 200 drives the variable attenuator 208 to attenuate the feedback signal by a predetermined power level and controls the power detector 210 to detect the feedback signal. The controller 200 compensates the power level of the feedback signal detected by the power detector 210 by the power level that is lost in the coupler 206 and the attenuation power level in the variable attenuator 208, and thus recognizes the compensated power level as the power level of the currently output transmission signal in step 310.

In step 312, the controller 200 compares the power level of the transmission signal that has to be transmitted with the power level of the currently output transmission signal, adjusts the AGC value by the power level difference, and controls the DA 202 according to the adjusted AGC value, thereby causing the power level of the currently output transmission power to be the same as the power of the transmission signal that has to be transmitted. In the present invention, the transmission power can be stably maintained when the power level of the currently output transmission power level is the same as the power of the transmission signal that has to be transmitted.

In step 314, the controller 200 determines if the mobile terminal is powered off. If so, the controller 200 terminates its operation. If the mobile terminal is not turned off, the controller 200 goes back to step 300 and performs steps 300 through 312 in order to cause the power level of the currently output transmission power level to be the same as the power of the transmission signal that has to be transmitted.

As described above, according to the present invention, a mobile terminal detects the power level of a currently output transmission signal, compares the detected power level with the power level of a transmission signal that has to be transmitted, and compensates the detected power level by the power difference, instead of using a separate RAS compensation table and a separate temperature and channel compensation table for controlling the power level of the transmission signal. Therefore, it is not necessary to separately measure AGC values for a predetermined number of terminals in order to create a separate transmission RAS compensation table. Moreover, compensation using the compensation table uses a statistical method, making it difficult to accurately adjust the transmission power of every terminal. On the other hand, according to the present invention, the power level of a transmission signal before being transmitted via an antenna is directly measured, is compared with the power level of a transmission signal that has to be transmitted, and is compensated by the power difference, thereby achieving accurate power control.

While the invention has been shown and described with reference to an exemplary embodiment thereof, it will be understood by those skilled in the art that various changes in form and details may be made therein without departing from the spirit and scope of the invention.

What is claimed is:

1. An apparatus for controlling the transmission power for a mobile terminal, the apparatus comprising:
    at least one first amplifier for amplifying according to a control signal a transmission signal to be transmitted via an antenna;
    a second amplifier for amplifying the transmission signal input from the at least one first amplifier by a predetermined power level according to an ON control signal;
    a coupler for splitting the transmission signal output from the second amplifier and outputting the split signal to the antenna and an attenuator;
    the attenuator for attenuating the power of the transmission signal input from the coupler by a predetermined power level according to the ON control signal;
    a power detector for detecting the power level of the amplified transmission signal; and
    a controller for determining the power level of a transmission signal that has to be transmitted, outputting the ON control signal to attenuator if the power level falls within a high power range, compensating the power level of the transmission signal detected by the power detector with the attenuation power in the coupler and the attenuation power in the variable attenuator, recognizing the compensated power level as the power level of a currently output transmission signal, comparing the recognized power level of the currently output transmission signal with the power level of the transmission signal that has to be transmitted, and controlling the amplifiers to compensate the recognized power level of the currently output transmission signal by a difference between the recognized power level and the power level of the transmission signal that has to be transmitted.

2. The apparatus of claim 1, wherein when the power level of the transmission signal that has to be transmitted falls within a low power range, the controller controls the attenuator to bypass to the power detector the transmission signal output from the coupler, compensates the power level of the transmission signal detected by the power detector by the attenuation power in the coupler, recognizes the compensated power level as the power level of the currently output transmission signal, compares the recognized power level of the currently output transmission signal with the power level of the transmission signal that has to be transmitted, and controls the amplifiers to compensate the recognized power level of the currently output transmission signal by a difference between the recognized power level and the power level of the transmission signal that has to be transmitted.

3. The apparatus of claim 1, wherein the at least one first amplifier is a drive amplifier and the second amplifier is a power amplifier.

4. The apparatus of claim 1, wherein the control signal used for the controller to control the at least one first amplifier to amplify the power level of the transmission signal to the determined power level is a transmission Automatic Gain Control (AGC) value Tx_AGC.

5. A method for controlling the transmission power for a mobile terminal that includes a first amplifier for amplifying a transmission signal by a predetermined power level according to a control signal, a second amplifier for amplifying the transmission signal output from the first amplifier by a predetermined power according to an ON control signal, and an antenna through which the transmission signal amplified by the second amplifier is transmitted, the method comprising:
 determining the power level of a transmission signal that has to be transmitted and outputting to the first amplifier and the second amplifier a control signal for amplifying the transmission signal to the determined power level;
 splitting the transmission signal output from the amplifiers into a transmission signal for transmission via the antenna and a feedback signal;
 detecting the power level of the feedback signal; and
 comparing the power level of the transmission signal output via the antenna with the power level of the transmission signal that has to be transmitted, and outputting to the first amplifier and the second amplifier a control signal to adjust the transmission power level based on compensate by a difference between the power level of the output transmission signal and the power level of the transmission signal that has to be transmitted.

6. The method of claim 5, wherein the detecting step comprises:
 determining if the power level of the transmission signal that has to be transmitted falls within a low power range;
 if the power level of the transmission signal that has to be transmitted falls within the low power range, detecting the power level of the transmission signal output from the first amplifier and the second amplifier; and
 compensating the detected power level of the transmission signal by the power that is lost during the splitting step and recognizing the compensated power level as the power level of the currently output transmission signal.

* * * * *